(12) United States Patent
Hsu

(10) Patent No.: US 11,418,177 B2
(45) Date of Patent: Aug. 16, 2022

(54) PROPAGATION DELAY BALANCING CIRCUIT, METHOD AND RANDOM NUMBER GENERATING CIRCUIT USING THE SAME

(71) Applicant: NUVOTON TECHNOLOGY CORPORATION, Hsinchu (TW)

(72) Inventor: Fu-Sheng Hsu, Hsinchu (TW)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/369,562

(22) Filed: Jul. 7, 2021

(65) Prior Publication Data

US 2022/0109436 A1 Apr. 7, 2022

(30) Foreign Application Priority Data

Oct. 5, 2020 (TW) .................................. 109134491

(51) Int. Cl.
*H03K 3/03* (2006.01)
*H03K 5/01* (2006.01)
*H03K 3/84* (2006.01)
*H03K 5/00* (2006.01)

(52) U.S. Cl.
CPC ............. *H03K 5/01* (2013.01); *H03K 3/0315* (2013.01); *H03K 3/84* (2013.01); *H03K 2005/00019* (2013.01)

(58) Field of Classification Search
CPC .......... H03K 5/01; H03K 3/0315; H03K 3/84; H03K 2005/00019

USPC ......................................................... 327/261
See application file for complete search history.

(56) References Cited

U.S. PATENT DOCUMENTS

| | | | |
|---|---|---|---|
| 10,951,199 B1* | 3/2021 | Jung | H03K 5/133 |
| 11,293,891 B2* | 4/2022 | Coln | G01N 27/3278 |
| 2019/0158299 A1* | 5/2019 | Poo | H04L 9/088 |
| 2020/0350893 A1* | 11/2020 | Scolari | H03L 7/0995 |
| 2021/0006254 A1* | 1/2021 | Kim | H03L 7/0814 |
| 2021/0226631 A1* | 7/2021 | Linn | B41J 2/04563 |
| 2021/0409029 A1* | 12/2021 | Moslehi Bajestan | H03L 7/16 |

* cited by examiner

*Primary Examiner* — Ryan Jager
(74) *Attorney, Agent, or Firm* — Muncy, Geissler, Olds & Lowe, P.C.

(57) ABSTRACT

A propagation delay balance circuit includes a signal generating circuit, a path switching element, and a signal change detecting element. The signal generating circuit includes delay chains for outputting delay signals respectively. The path switching element has input terminals and output terminals. Each output terminal of the path switching element is electrically connected to the input terminal of each delay chain one-to-one, and input terminals of the path switching element are electrically connected one-to-one to the output terminals of the delay chains. The path switching element is controlled by the path switching controlling signal to change the one-to-one internal electrical connection between input terminals and output terminals of the path switching element. The signal change detecting element is electrically connected to the path switching element, and generates a path switching controlling signal according to delay signals of the path switching element.

10 Claims, 6 Drawing Sheets

PROPAGATION DELAY BALANCING CIRCUIT, METHOD AND RANDOM NUMBER GENERATING CIRCUIT USING THE SAME

CROSS-REFERENCE TO RELATED APPLICATION

This application claims the benefit of Taiwan Patent Application No. 109134491, filed on Oct. 5, 2020, in the Taiwan Intellectual Property Office, the disclosure of which is incorporated herein in its entirety by reference.

BACKGROUND

1. Field

The present invention relates to a propagation delay balancing method, and more particularly to a propagation delay balancing method applied to a random number generating circuit.

2. Description of the Related Art

In all digital circuits, a true random number generator (True-Random-Number-Generator, TRNG) is often used to establish a reference clock signal, and the true random number generator is usually achieved by using a ring oscillator implemented by inverters. However, in the complementary Metal-Oxide-Semiconductor (CMOS) process, owing to the influence of process and environmental variation, the ring oscillator causes systematic errors due to component mismatch which reduces the randomness of the reference clock signal.

SUMMARY

It can be understood from above description that the technical problems to be solved is that the random number generating circuit reduces the randomness of the reference clock signal due to the process variation of the semiconductor process.

In order to solve the above-mentioned conventional problems, it is necessary to adopt a propagation delay balancing circuit or method to make the delay signals without delay errors from the semiconductor process variation. The embodiment of the present invention discloses a random number generating circuit, which comprises a signal generating circuit, a path switching element, a signal change detecting element, and a signal judging unit. The signal generating circuit, the path switching element and the signal change detecting element constitute the propagation delay balancing circuit described above. The signal generating circuit comprises a first delay chain and a second delay chain, and the first delay chain and the second delay chain output the first delay signal and the second delay signal, respectively.

The path switching element has a first output terminal and a second output terminal. When the path switching element is in a parallel state, an output terminal of the first delay chain is connected to an input terminal of the first delay chain via the first output terminal, and an output terminal of the second delay chain is connected to an input terminal of the second delay chain via the second output terminal. When the path switching element is in a cross state, an output terminal of the first delay chain is connected to an input terminal of the second delay chain via the second output terminal, and an output terminal of the second delay chain is connected to an input terminal of the first delay chain via the second output terminal.

The signal change detecting element is connected to the first output terminal and the second output terminal of the path switching element, and the output terminal of the signal change detecting element is connected to a clock signal terminal of the path switching element. The signal change detecting element controls the path switching element cyclically switches between the parallel state and the cross state. The signal change detecting element generates a trigger signal according to switching times of the path switching element.

The signal judging unit has a first input terminal connected to the first output terminal of the path switching element, and a second input terminal connected to a second output terminal of the path switching element. The signal judging unit outputs the signal of the first output terminal or the second output terminal of the path switching element as a random number signal according to the trigger signal.

According to an embodiment of the present invention, the signal change detecting element controls the path switching element to cyclically switch between the parallel state and the cross state according to changes of the first delay signal and the second delay signal.

According to an embodiment of the present invention, the signal judging unit comprises a first flip-flop and a second flip-flop. An input terminal of the first flip-flop is connected to the first output terminal of the path switching element, and a clock signal terminal of the first flip-flop is connected to the second output terminal of the path switching element. An input terminal of the second flip-flop is connected to an output terminal of the first flip-flop, a clock signal terminal of the second flip-flop receives the trigger signal, and an output terminal of the second flip-flop generates a random number signal.

According to an embodiment of the present invention, the random number generating circuit further comprises a calibrating circuit for adjusting the start-up time of the first delay chain and the second delay chain according to the random number signal.

An embodiment of the present invention provides a propagation delay balancing circuit, which comprises a signal generating circuit, a path switching element, and a signal change detecting element.

The signal generating circuit comprises a plurality of delay chains for respectively outputting delay signals.

The path switching element has a plurality of input terminals and a plurality of output terminals. The plurality of output terminals of the path switching element are electrically connected one-to-one to each input terminal of the plurality of delay chains, and the plurality of the input terminals of the path switching element are electrically connected one-to-one to each output terminal of the plurality of delay chains to receive each of the delay signals respectively. The path switching element is controlled by a path switching controlling signal to change an internal electrical connection between the plurality of input terminals and the plurality of output terminals of the path switching element. The internal electrical connection is a one-to-one connection.

The signal change detecting element is electrically connected to the path switching element, and generating the path switching controlling signal according to the plurality delay signals of the plurality output terminals of the path switching element. When switching times of the internal electrical connection of the path switching element is a multiple of a specific value, the delay time between the delay signals of the plurality of output terminals of the path switching element is substantially equal.

According to an embodiment of the present invention, each delay chain comprises a ring oscillator.

According to an embodiment of the present invention, each delay signal is propagated in at least two of the plurality of delay chains.

According to an embodiment of the present invention, the ring oscillator comprises an odd number of inverters.

An embodiment of the present invention also provides a non-volatile storage media, which comprises multiple pieces of code for reading by a circuit automatization design software. The multiple pieces of code are used to record and form a propagation delay balancing circuit.

An embodiment of the present invention also provide a propagation delay balancing method, which comprises at least the following steps: using a first delay chain and a second delay chain to generate a first delay signal and a second delay signal respectively.

The first delay signal and the second delay signal are respectively inputted to the first input terminal and the second input terminal of the path switching element. The one-to-one internal electrical connection between the first input terminal, the second input terminal, the first output terminal and the first input terminal of the path switching element is determined by the path switching control signal.

According to the one-to-one internal electrical connection between the first input terminal, the second input terminal, the first output terminal and the second output terminal of the path switching element, the first delay signal is fed back to one of the input terminal of the first delay chain and the input terminal of the second delay chain, and the second delay signal is fed back to the other of the input terminal of the first delay chain and the input terminal of the second delay chain.

Using a signal change detecting element to generate a path switching controlling signal according to the first delay signal and the second delay signal. When a switching times of a path switching element is a multiple of a specific value, the first delay signal and the second delay signal outputted by the path switching element having substantially equal delay time.

As mentioned above, the random number generating circuit and the propagation delay balancing method of the present invention have the following advantages:

By cyclically switching the path switching element between the parallel state and the cross state, the delay signals outputted by the ring oscillators of the first delay chain and the second delay chain can be made to pass through the parallel state and the cross state once each. That is, the delay signals both pass twice the first delay chain and the second delay chain to generate the same delay path, which reduces the mismatch between the first delay signal and the second delay signal of the random number generating circuit caused by the variation of the semiconductor process.

The signal change detecting element detects the change of the first delay signal and the second delay signal (for example, from a low potential to a high potential, or from a high potential to a low potential) to control the path switching element. The signal change detecting element generates a trigger signal according to the switching times of the path switching element. When the signal change detecting element further combines with the second flip-flop, the random number signal outputted by the second flip-flop can be determined by the system noise and the randomness of the random number signal is improved.

BRIEF DESCRIPTION OF THE DRAWINGS

In order to make the above and other purposes, features, advantages and embodiments of the present invention more obvious and understandable, the description of the accompanying drawings is as follows.

DETAILED DESCRIPTION

Hereinafter, an embodiment of the present invention will be described according to FIG. 1 to FIG. 5D. The description is not intended to limit the implementation of the present invention, but only an example of the present invention.

Figure 1:
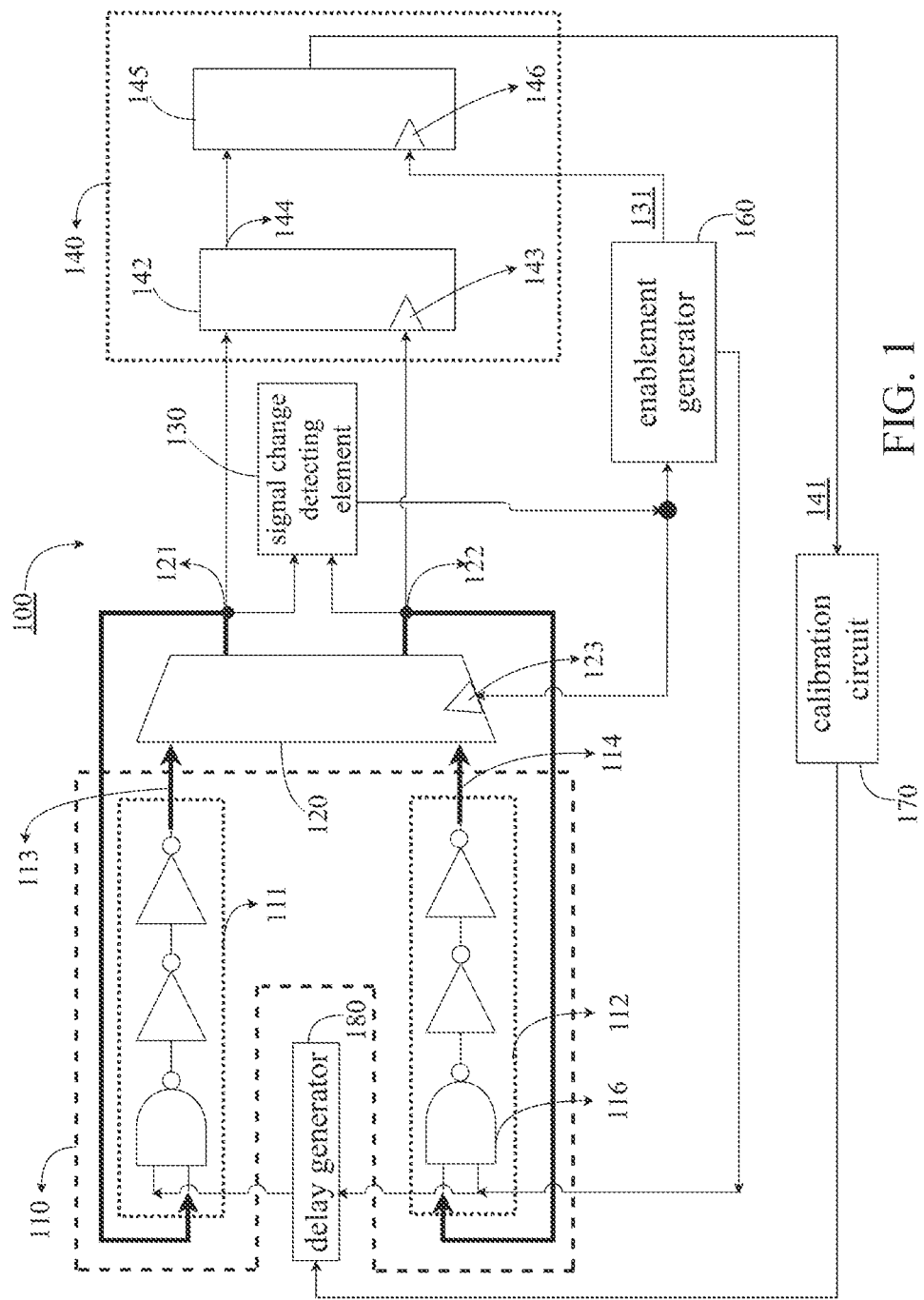
FIG. 1 is a schematic diagram of a random number generating circuit according to an embodiment of the present invention.

Refer to FIG. 1, which is a schematic diagram of a random number generating circuit according to an embodiment of the present invention, and in conjunction with FIGS. 5A to 5D, which is a diagram of the operation state of a random number generating circuit according to an embodiment of the present invention. As shown in the figures, the random number generating circuit 100 comprises a signal generating circuit 110, a path switching element 120, a signal change detecting element 130, and a signal judging unit 140. A propagation delay balancing circuit can be formed by the signal generating circuit 110, the path switching element 120, and the signal change detecting element 130.

The signal generating circuit 110 comprises a first delay chain 111 and a second delay chain 112, and the first delay chain 111 and the second delay chain 112 outputs a first delay signal and a second delay signal respectively.

The path switching element 120 has a first output terminal 121 and a second output terminal 122. When the path switching element 120 is in a parallel state, the output terminal 113 of the first delay chain 111 is connected to the input terminal of the first delay chain 111 via the first output terminal 121 of the path switching element 120, and the output terminal 114 of the second delay chain 112 is connected to the input terminal of the second delay chain 112 via the second output terminal 122 of the path switching element 120.

When the path switching element 120 is in a cross state, the output terminal 113 of the first delay chain 111 is connected to the input terminal of the second delay chain 112 via the second output terminal 122 of the path switching element 120, and the output terminal 114 of the second delay chain 112 is connected to the input terminal of the first delay chain 111 via the first output terminal 121 of the path switching element 120.

The signal change detecting element 130 is connected to the first output terminal 121 and the second output terminal 122 of the path switching element 120, and the output terminal of the signal change detecting element 130 is connected to a clock signal terminal 123 of the path switching element 120. The signal change detecting element 130 controls the path switching element 120 to cyclically switch between the parallel state and the cross state. The signal change detecting element 130 generates a trigger signal 131 according to switching times of the path switching element 120.

The signal judging unit 140 has a first input terminal connected to the first output terminal 121 of the path switching element 120, and a second input terminal connected to the second output terminal 122 of the path switching element 120. The signal judging unit 140 outputs the signal on one of the first output terminal 121 and the second output terminal 122 of the path switching element 120 as a random number signal 141 according to the trigger signal 131.

According to an embodiment of the present invention, the signal change detecting element 130 controls the path switching element 120 to cyclically switch between the parallel state and the cross state according to the first delay signal and the second delay signal.

According to an embodiment of the present invention, the path switching element 120 is a multiplexer.

According to an embodiment of the present invention, the signal judging unit 140 comprises a first flip-flop 142 and a second flip-flop 145. The input terminal of the first flip-flop 142 is connected to the first output terminal 121 of the path switching element 120, and a clock signal terminal 143 of the first flip-flop 142 is connected to the second output terminal 122 of the path switching element 120.

The input terminal of the second flip-flop 145 is connected to the output terminal 144 of the first flip-flop 142, a clock signal terminal 146 of the second flip-flop 145 receives the trigger signal 131, and the output terminal of the second flip-flop 145 generates the random number signal 141.

It can be understood, based on the above description and with the operation state diagrams in FIGS. 5A to 5D, the first delayed signal and the second delayed signal of the signal generating circuit 110 respectively pass through the first delay chain 111 and the second delay chain 112 twice because the path switching element 120 is cyclically switched between the parallel state and the cross state. Because the first delay signal and the second delay signal pass the same paths, the delay time caused by the first delay signal and the second delay signal can be highly close. Because the signal received by the first flip-flop 142 has highly close time delay, the output signal of the first flip-flop 142 is determined by the random noise of the system. With the control of the signal change detecting element 130, after the path switching element 120 undergoes a switching period of one parallel state and one cross state, a trigger signal 131 is generated and the second flip-flop 145 outputs the random number signal 141.

According to an embodiment of the present invention, the first flip-flop 142 may be replaced by a comparator.

According to an embodiment of the present invention, the first delay chain 111 and the second delay chain 112 may be ring oscillators, and the input of the ring oscillator may be one of the input terminals of a NAND gate 116, or an input terminal of the NOR gate (not shown in FIG. 1).

The above-mentioned ring oscillator is generally composed of an odd number of inverters, and its output terminal is connected to its input terminal, so the output signal and input signal of the ring oscillator will be cyclically oscillated between high and low potential. The input terminal of the ring oscillator also can be replaced by a logic gate that can generate reversed signals, such as NAND gates, NOR gates, and so on, to achieve the same function with an enable signal.

The path of the delay signal passing through the ring oscillator is different depending on the received signal being at high potential or low potential. For example, in a condition that each ring oscillator include three inverter and each inverter is formed by a P-type transistor and a N-type transistor connected in serial, when the input signal is at low potential, the delay signal passes through two P-type transistor and one N-type transistor, and when the input signal is at high potential, the delay signal passes one P-type transistor and two N-type transistors; in an embodiment, in a condition that each ring oscillator include five inverter and each inverter is formed by a P-type transistor and a N-type transistor connected in serial, when the input signal is at low potential, the delay signal passes through three P-type transistor and two N-type transistor, and when the input signal is at high potential, the delay signal passes two P-type transistor and three N-type transistors. In other words, when the input signal is at low potential, the delay signal passes one more P-type transistor than the N-type transistor, and when the input signal is at high potential, the delay signal passes one more P-type transistor than the N-type transistor, The switching time point of the path switching element 120 can be triggered when the signal change detecting element 130 detects the change in the signals on the first output terminal 121 and the second output terminal 122 of the path switching element 120. For example, when the signal is changed from a low potential to a high potential, the signal change detecting element 130 generates a corresponding signal to the clock signal terminal 123 of the path switching element 120 to switch the state of the path switching element 120.

Figure 5A:
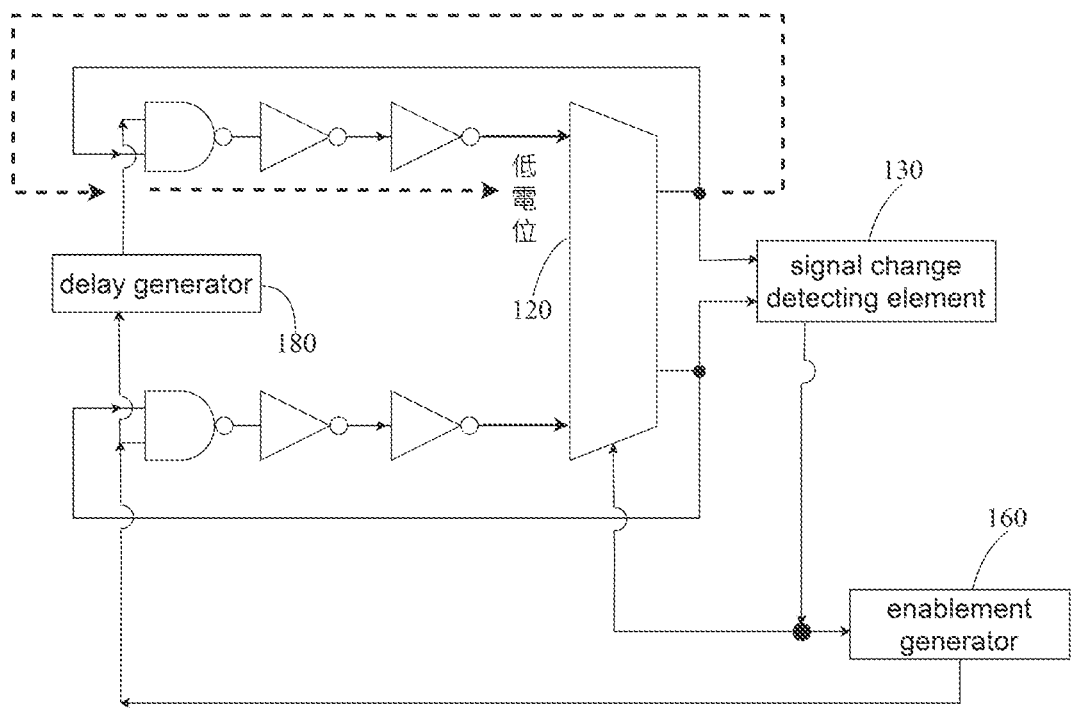
FIG. 5A to FIG. 5D are operation state diagrams of the random number generating circuit according to the embodiment of the present invention.
Figure 5B:
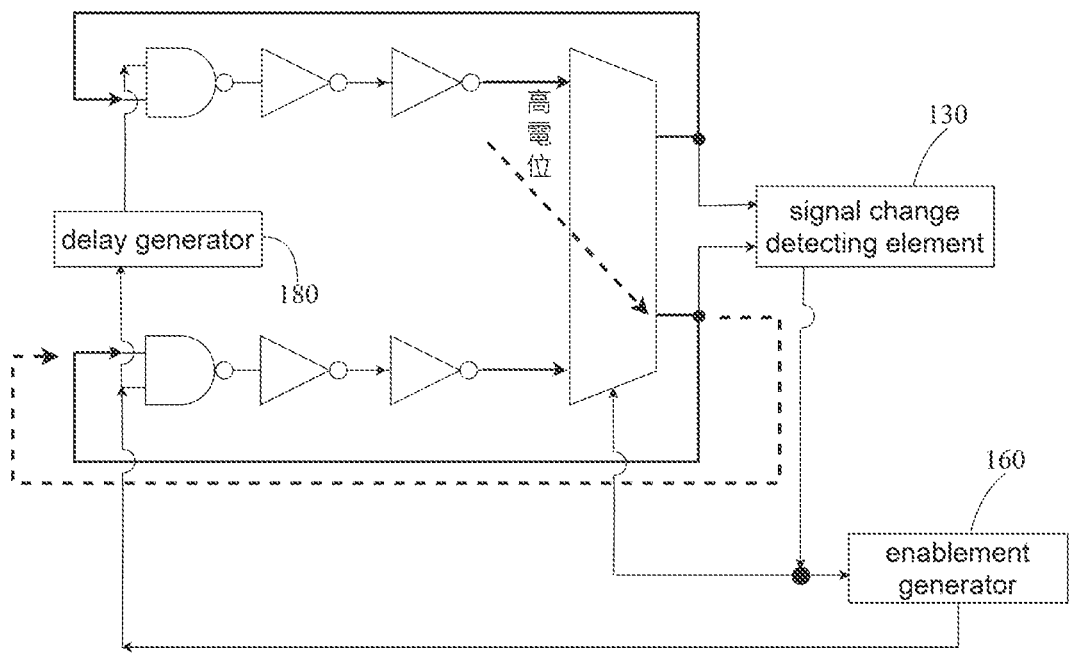
Figure 5C:
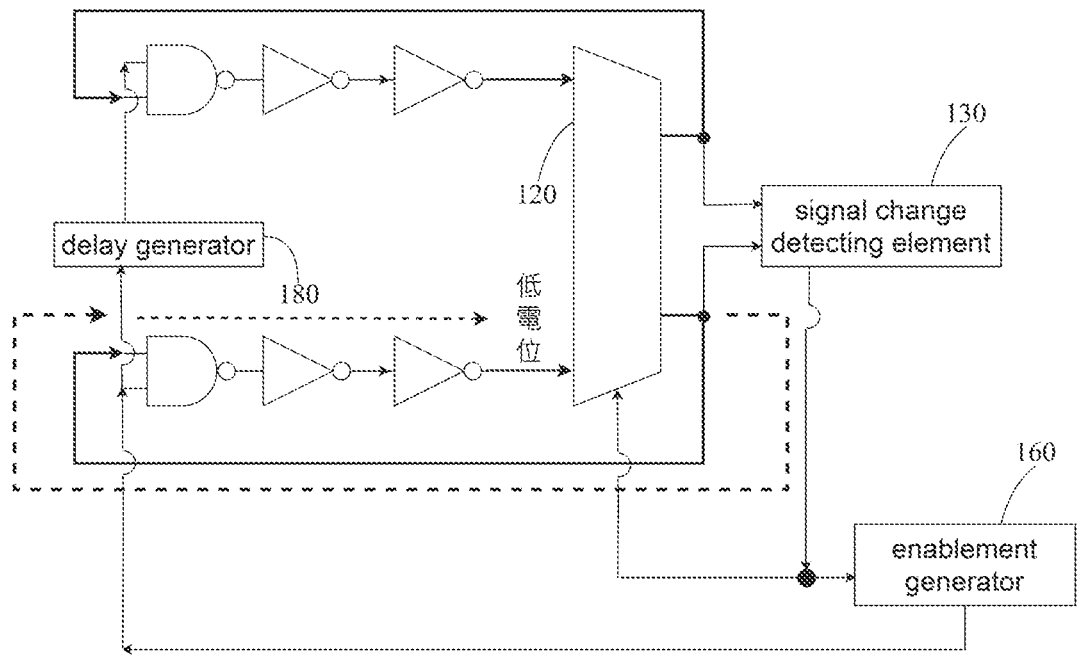
Figure 5D:
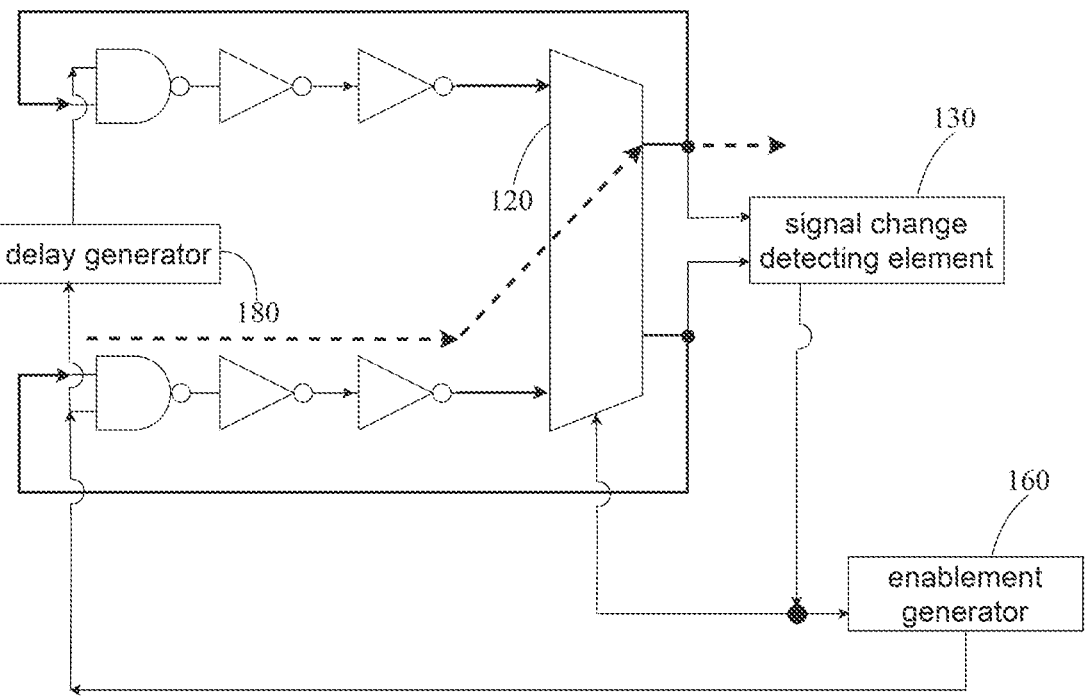

Therefore, after the above-mentioned first delay signal passes the delay chain through periods of the parallel state and the cross state of the path switching element 120, the total delay of the delay signal is the sum of items (a) to (d) as below:
(a) delay of the low potential output signal in the first delay chain 111 (as shown in FIG. 5A)
(b) delay of the high potential output signal in the first delay chain 111 (as shown in FIG. 5B)
(c) delay of the low potential output signal in the second delay chain 112 (as shown in FIG. 5C)
(d) delay of the high potential output signal in the second delay chain 112 (as shown in FIG. 5D)

Based on the above description, the first delay signal generated by the first delay chain 111 passes through the first delay chain 111 twice, and then passes through the second delay chain 112 twice, so the number of P-type transistors through which the first delay signal passes is the same as that of N-type transistors through which the first delay signal passes. In the same way, the second delay signal generated by the second delay chain 112 passes through the second delay chain 112 twice, and then passes through the first delay chain 111 twice, so the number of P-type transistors through which the second delay signal passes is the same as that of N-type transistors through which the second delay signal passes. That is, after the second delay signal passes through the parallel state and the cross state of the path switching element 120, the total delay of the second delay signals is the same as that of the first delay signal.

Furthermore, after the first delay signal generated by the first delay chain 111 and the second delay signal generated by the second delay chain 112 pass through a parallel state and a cross state of the path switching element 120, the total delays of the two delay signals are the same.

According to an embodiment of the present invention, the random number generating circuit 100 further comprises an enable signal generator 160 connected to the output terminal of the signal change detecting element 130 and the clock signal terminal 146 of the second flip-flop 145, and configured to generate the trigger signal 131 mentioned above. The enable signal generator 160 is connected to the other input terminal of the NAND gate 116 of the second delay chain 112 or connected to the other input terminal of the NOR gate.

According to an embodiment of the present invention, the random number generating circuit 100 further comprises a calibration circuit 170 and a delay generator 180.

The input terminal of the calibration circuit 170 is connected to the output terminal of the second flip-flop 145.

The input terminal of the delay generator 180 is connected to the output terminal of the calibration circuit 170, and connected to the output terminal of the enable signal generator 160. The output terminal of the delay generator 180 is connected to the other input terminal of the NAND gate 116 of the first delay chain 111, or connected to the other input terminal of the NOR gate.

The calibration circuit 170 is used to judge whether the random number signal 141 is sufficiently random or not. When one of the high potential signal or the low potential signal is appeared more than the other, the calibration circuit 170 controls the delay value of the delay generator 180, so as to control the start-up time of the first delay chain 111 and the second delay chain 112.

The function of the enable signal generator 160 is to control the switching times (for example, 2, 4, 6, and 8 times) of the path switching element 120 to generate the trigger signal 131 corresponding to the signal change detecting element 130. Based on the trigger signal 131, the delay generator 180 controls the start-up time of the first delay chain 111 and the second delay chain 112.

Figure 2:
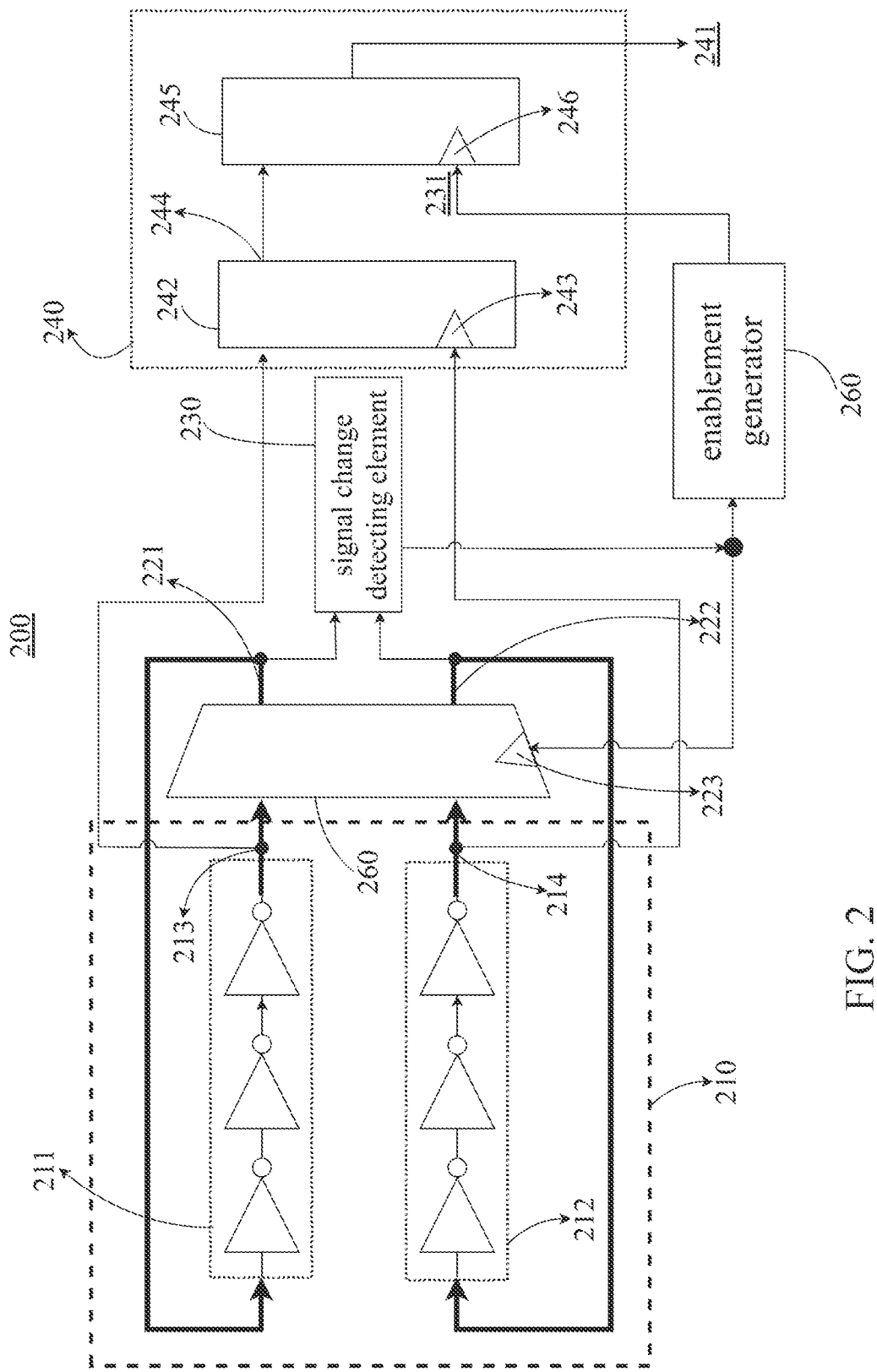
FIG. 2 is a schematic diagram of a random number generating circuit according to another embodiment of the present invention.

Refer to FIG. 2, which is a schematic diagram of a random number generating circuit according to another embodiment of the present invention, and in conjunction with FIGS. 5A to 5D. As shown in the figures, the random number generating circuit 200 comprises a signal generating circuit 210, a path switching element 220, a signal change detecting element 230, and a signal judging unit 240.

The signal generating circuit 210 comprises a first delay chain 211 and a second delay chain 212, and the first delay chain 211 and the second delay chain 212 are ring oscillators composed of the same odd number of inverters. The first delay chain 211 and the second delay chain 212 respectively output the first delay signal and the second delay signal.

The path switching element 220 has a first output terminal 221 and a second output terminal 222. When the path switching element 220 is in the parallel state, the output terminal 213 of the first delay chain 211 is connected to the input terminal of the first delay chain 211 via the first output terminal 221 of the path switching element 220, and the output terminal 214 of the second delay chain 212 is connected to the input terminal of the second delay chain 212 via the second output terminal 222 of the path switching element 220.

When the path switching element 220 is in the cross state, the output terminal 213 of the first delay chain 211 is connected to the input terminal of the second delay chain 212 via the second output terminal 222 of the path switching element 220, and the output terminal 214 of the second delay chain 212 is connected to the input terminal of the first delay chain 211 via the first output terminal 221 of the path switching element 220.

The signal change detecting element 230 is connected to the first output terminal 221 and the second output terminal 222 of the path switching element 220, and the output terminal of the signal change detecting element 230 is connected to a clock signal terminal 223 of the path switching element 220. The signal change detecting element 230 controls the path switching element 220 to cyclically switch between the parallel state and the cross state. The signal change detecting element 230 generates a trigger signal 231 according to the switching times of the path switching element 220.

The signal judging unit 240 has a first input terminal connected to the output terminal 213 of the first delay chain 211, and a second input terminal connected to the output terminal 214 of the second delay chain 212. The signal judging unit 240 outputs one of the first delay signal and the second delay signal as a random number signal 241 according to the trigger signal 231.

According to an embodiment of the present invention, the signal change detecting element 230 controls the path switching element 220 to cyclically switch between the parallel state and the cross state according to the first delay signal and the second delay signal.

According to an embodiment of the present invention, the path switching element 220 is a multiplexer.

According to an embodiment of the present invention, the signal judging unit 240 comprises a first flip-flop 242 and a second flip-flop 245. The input terminal of the first flip-flop 242 is connected to the first output terminal 221 of the path switching element 220, and the clock signal terminal 243 of the first flip-flop 242 is connected to the second output terminal 222 of the path switching element 220.

The input terminal of the second flip-flop 245 is connected to the output terminal 244 of the first flip-flop 242, the clock signal terminal 246 of the second flip-flop 245 receives the trigger signal 231, and the output terminal of the second flip-flop 245 outputs a random number signal 241.

The difference between embodiments disclosed in FIG. 2 and FIG. 1 is that the output terminal 213 of the first delay chain 211 and the output terminal 214 of the second delay chain 212 shown in FIG. 2 are directly connected to the first flip-flop 242 without passing through the path switching element 220. The effect of the embodiment shown in FIG. 2 is the same as that of the embodiment disclosed in FIG. 1.

According to an embodiment of the present invention, the first flip-flop 242 can be replaced by a comparator.

According to an embodiment of the present invention, the random number generation circuit 200 further comprises an enable signal generator 260.

The enable signal generator 260 is connected between the output terminal of the signal change detecting element 230 and the clock signal terminal 246 of the second flip-flop 245, and generates the trigger signal 231.

The input terminal of the calibration circuit 270 is connected to the output terminal of the second flip-flop 245 and connected to the output terminal of the enable signal generator 260, and the output terminal of the calibration circuit 270 is connected to the clock signal terminal 223 of the path switching element 220.

Another difference between the embodiments disclosed in FIG. 2 and FIG. 1 is that when the input terminal of the signal generating circuit 210 is implemented without using the NAND gate 116 or NOR gate, and the delay generator 180 as disclosed in FIG. 1.

In the foregoing embodiments, each of the number of the input terminals of the delay chain, the number of the output terminals of the delay chain, and the number of the input terminals of the path switching element, and the number of the output terminals of the path switching element is described by taking two as an example. In other embodiments, the number of above-mentioned terminals may be greater than two. When each of the number of the input terminals of the delay chain, the number of the output terminals of the delay chain, and the number of the input terminals of the path switching element, and the number of the output terminals of the path switching element is greater than two, the signal change detecting element detects the times of signal change at the output terminal of the path switching element, and determines a path switching control signal based on the times of signal change mentioned above.

Figure 3:
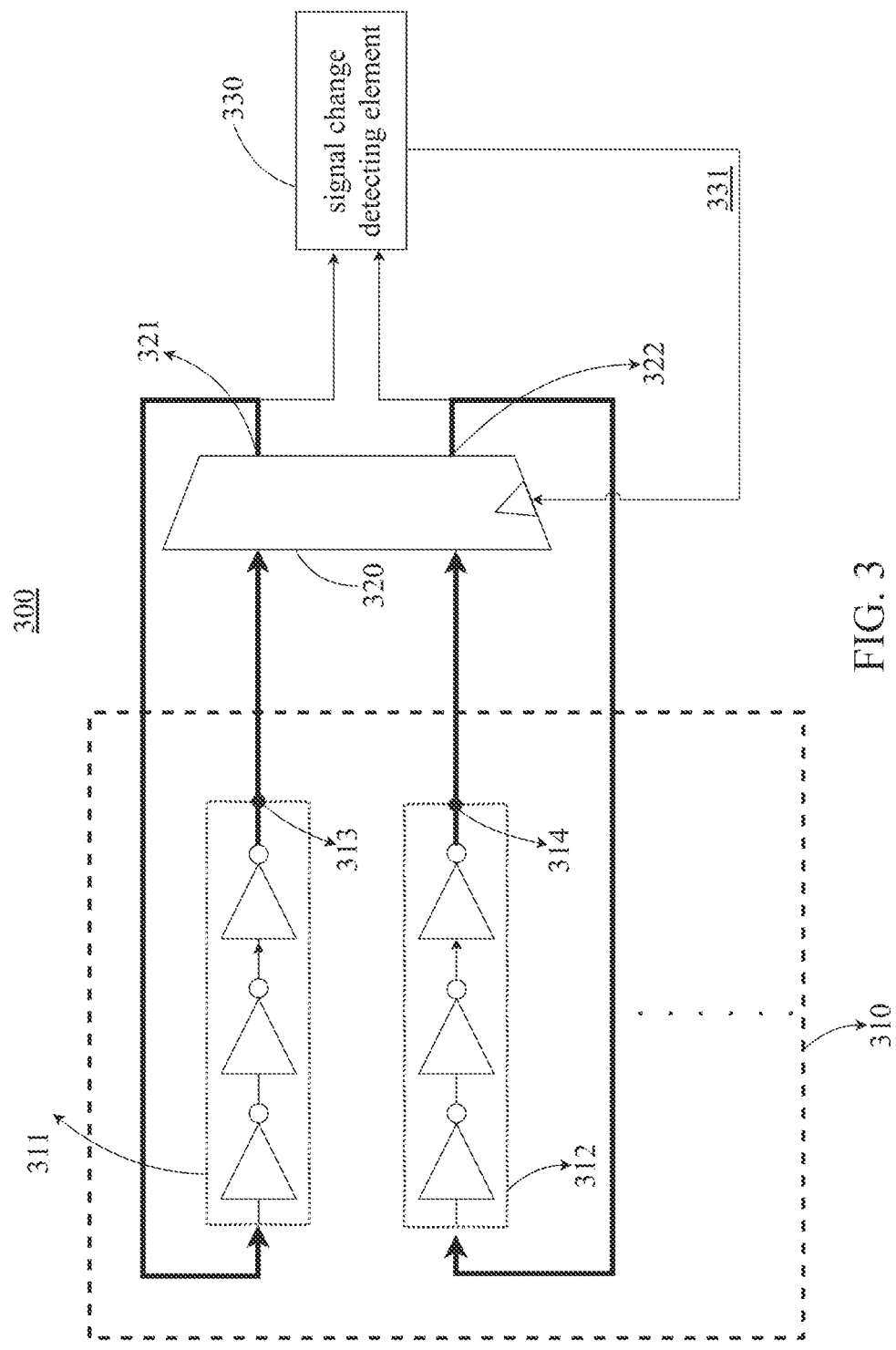
FIG. 3 is a schematic diagram of a propagation delay balancing circuit according to an embodiment of the present invention.

Refer to FIG. 3, which is a schematic diagram of a propagation delay balancing circuit according to an embodiment of the present invention. As shown in the figure, the propagation delay balancing circuit 300 comprises a signal generating circuit 310, a path switching element 320, and a signal change detecting element 330.

The signal generating circuit 310 comprises a plurality of delay chains (for example, 311 and 312) for outputting delay signals respectively.

The path switching element 320 has a plurality of input terminals and a plurality of output terminals (for example, 321 and 322). The plurality of output terminals of the path switching element 320 are one-to-one electrically connected to the input terminals of the delay chains. The plurality input terminals of the path switching element 320 are one-to-one electrically connected to the output terminals (for example, 313 and 314) of the plurality of delay chains to receive the delay signals. The path switching element 320 is controlled by the path switching control signal 331 to change the internal electrical connection between the multiple input terminals and the multiple output terminals of the path switching element, and the internal electrical connection is one-to-one connection.

The signal change detecting element 330 is electrically connected to the path switching element 320, and the signal change detecting element 330 generates the path switching control signal 331 according to the plurality of delay signals on the plurality of output terminals of the path switching element 320. When the switching times of the internal electrical connection of the path switching element is a multiple of a specific value, the delay times of each delay signals on the plurality of output terminals of the path switching element are substantially equal to each other.

The path switching element 320 and the signal change detecting element 330 can be implemented in different ways. For example, the path switching element 320 can be implemented with multiple switching transistors, and the signal change detecting element 330 can be implemented by logic gate.

According to an embodiment of the present invention, each delay signal is propagated in at least two of the plurality of delay chains.

It can be understood from the above description, the way that the two delay signals in the propagation delay balancing circuit 300 achieve delay balance may not only propagate in two delay chains, but also in three delay chains or more. For example, the first delay signal may be switched to the second delay chain 312 by the path switching element 320 after passing through the first delay chain 311 twice, the first delay signal may be switched to the third delay chain (not shown in the FIG. 3) after passing through the second delay chain 312 twice, and finally switched back to the first delay chain 311.

Similarly, the propagation of the second delay signal may first pass through the second delay chain 312 twice, then pass through the third delay chain twice, and finally pass through the first delay chain 311 twice. In this way, the first delay signal and the second delay signal both go through the same delay path to achieve the result of propagation delay balance. Accordingly, the switching times of the internal electrical connection of the path switching element 320 is three times as a specific value.

By the same token, the two delay signals can propagate in more delay chains, and the result of propagation delay balance can be achieved by more different propagation modes through the specific switching times of the path switching element 320.

An embodiment of the present invention also provides a non-volatile storage media, which comprises multiple pieces of code for reading by circuit automatization design software. The multiple pieces of code are used to record and form the propagation delay balancing circuit 300 described above.

Figure 4:
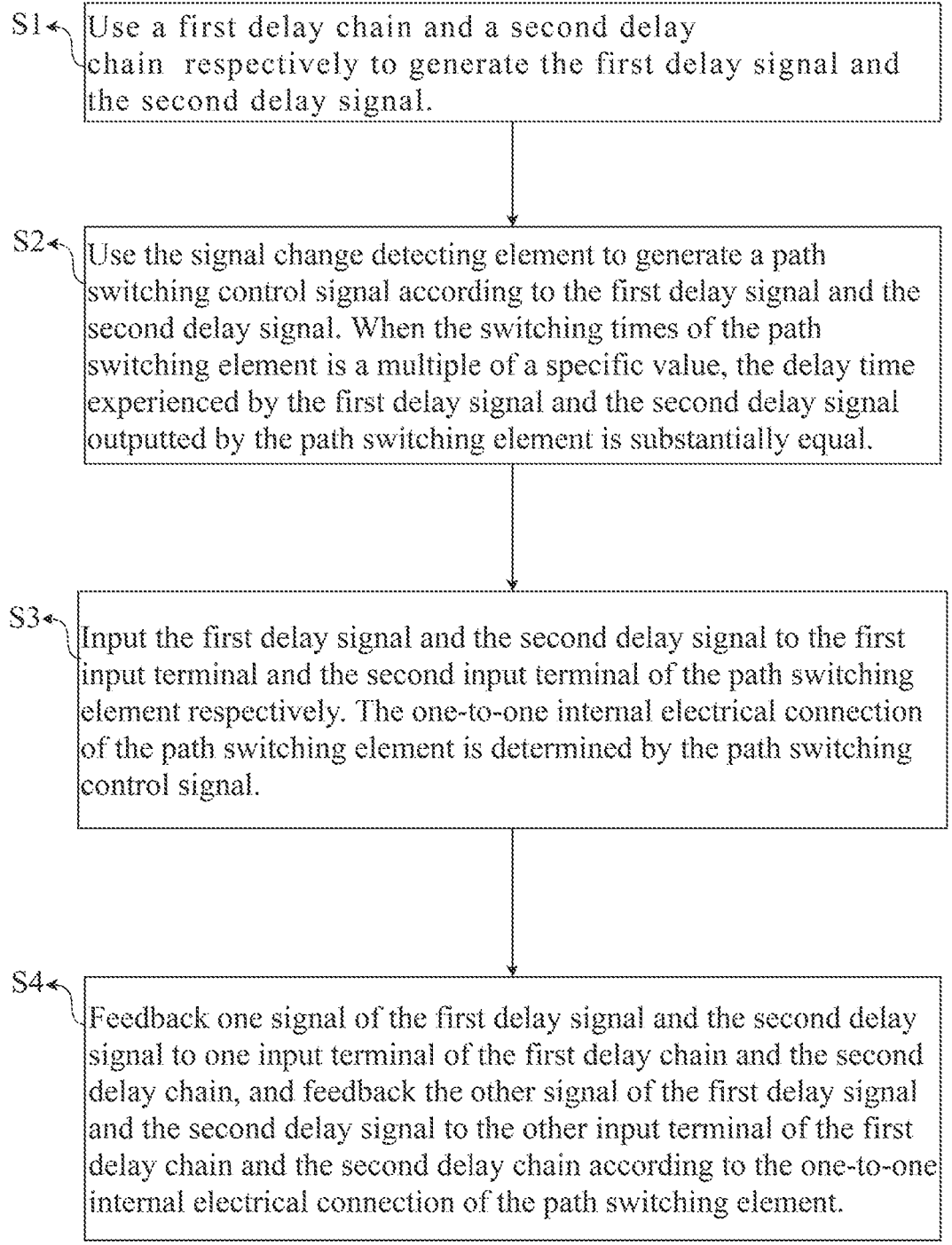
FIG. 4 is a flowchart of a propagation delay balancing method according to an embodiment of the present invention.

Refer to FIG. 4, which is a flowchart of a propagation delay balancing method according to an embodiment of the present invention, which can be applied to the aforementioned random number generating circuit 100, the random number generating circuit 200, and the propagation delay balancing circuit 300. As shown in the FIG. 4, the propagation delay balancing method comprises at least the following steps (S1 to S4):

Step S1: use the first delay chain 311 and the second delay chain 312 to generate the first delay signal and the second delay signal respectively.

Step S2: use the signal change detecting element 330 to generate a path switching control signal 331 according to the first delay signal and the second delay signal. When the switching times of the path switching element 320 is a multiple of a specific value, the delay time experienced by the first delay signal and the second delay signal outputted by the path switching element 320 is substantially equal.

Step S3: input the first delay signal and the second delay signal to the first input terminal and the second input terminal of the path switching element 320 respectively. The one-to-one internal electrical connection between the first input terminal, the second input terminal, the first output terminal, and the second output terminal of the path switching element 320 is determined by the path switching control signal 331.

Step S4: feed one of the first delay signal and the second delay signal back to one input terminal of the first delay chain and the second delay chain, and feed the other of the first delay signal and the second delay signal back to the other input terminal of the first delay chain and the second delay chain according to the one-to-one internal electrical connection between the first input terminal, the second input terminal, the first output terminal 321 and the second output terminal 322 of the path switching element 320.

After the step S4 is completed, the flow of the method returns to the step S1 to proceed. In other embodiments, it is also possible that the internal electrical connection has a default setting, and the step S4 is executed after the step S2 and before the step S3.

With the above propagation delay balancing method, the two delay signals can also propagate in more delay signal chains. It only uses the path switching element 320 to switch the multiple times of a specific value, the two delay signals can pass through the same delay path to achieve the same delay time.

For example, the specific value switched by the path switching element 320 may be 3, and the internal electrical connection of the path switching element 320 is switched from 1-1, 2-2, 3-3 (representing the first input terminal connected to the first output terminal, the second input terminal is connected to the second output terminal, and the third input terminal is connected to the third output terminal, and so on), and to 1-2, 2-3, 3-1, and 1-3, 2-1, 3-2, in a sequential order, or switched from 1-1, 2-2, 3-3, to 1-3, 2-1, 3-2, and 1-2, 2-3, 3-1 in a sequential order. Therefore, it can be understood that the two delayed signals can propagate the same delay paths to achieve the same delay times.

The above description is only exemplary, not restrictive. Any equivalent modification or alteration that does not deviate from the spirit and scope of the present invention shall be included in the scope of the appended patent application claims.

What is claimed is:

1. A random number generating circuit, comprising:
   a signal generating circuit comprising a first delay chain and a second delay chain, wherein the first delay chain and the second delay chain respectively output a first delay signal and a second delay signal;
   a path switching element having a first output terminal and a second output terminal, wherein when the path switching element is in a parallel state, an output terminal of the first delay chain is connected to an input terminal of the first delay chain via the first output terminal of the path switching element, and an output terminal of the second delay chain is connected to an input terminal of the second delay chain via the second output terminal of the path switching element, wherein when the path switching element is in a cross state, an output terminal of the first delay chain is connected to an input terminal of the second delay chain via the second output terminal of the path switching element, and an output terminal of the second delay chain is connected to an input terminal of the first delay chain via the second output terminal of the path switching element;
   a signal change detecting element connected to the first output terminal and the second output terminal of the path switching element, wherein the signal change detecting element controls the path switching element to cyclically switch between the parallel state and the cross state, and generates a trigger signal according to a switching times of the path switching element; and
   a signal judging unit having a first input terminal connected to the first output terminal of the path switching element, and a second input terminal connected to the second output terminal of the path switching element, wherein the signal judging unit outputs the signal of the first output terminal or the second output terminal of the path switching element as a random number signal according to the trigger signal.

2. The random number generating circuit of claim 1, wherein the signal change detecting element controls the path switching element to switch between the parallel state and the cross state cyclically according to the first delay signal and the second delay signal.

3. The random number generating circuit of claim 1, wherein the signal judging unit comprises:
   a first flip-flop having an input terminal connected to the first output terminal of the path switching element, and a clock signal terminal connected to the second output terminal of the path switching element; and
   a second flip-flop having an input terminal of the second flip-flop connected to an output terminal of the first flip-flop, a clock signal terminal receiving the trigger signal, and an output terminal outputting the random number signal.

4. The random number generating circuit of claim 3, further comprising:
   a calibrating circuit configured to adjust start-up times of the first delay chain and the second delay chain according to the random number signal.

5. A propagation delay balancing circuit, comprising:
   a signal generating circuit comprising a plurality of delay chains, wherein each of the plurality of delay chains is configured to output a delay signal;
   a path switching element having a plurality of input terminals and a plurality of output terminals, wherein the plurality of output terminals of the path switching element are electrically connected one-to-one to input terminals of the plurality of delay chains, wherein the plurality of input terminals of the path switching element are electrically connected one-to-one to output terminals of the plurality of delay chains to receive the delay signals, wherein the path switching element is controlled by a path switching controlling signal to change an internal electrical connection between the plurality of input terminals and the plurality of output terminals of the path switching element, wherein the internal electrical connection is a one-to-one connection;
   a signal change detecting element electrically connected to the path switching element, and configured to generate the path switching controlling signal according to the plurality of delay signals of the path switching element, wherein when times of switching the internal electrical connection of the path switching element is a multiple of a specific value, the delay times of the delay signals on the plurality of output terminals of the path switching element are substantially equal to each other.

6. The propagation delay balancing circuit of claim 5, wherein each of the plurality of delay chains comprises a ring oscillator.

7. The propagation delay balance circuit of claim 5, wherein each of the plurality of delay signals is propagated in at least two of the plurality of delay chains.

8. The propagation delay balance circuit of claim 6, wherein the ring oscillator comprises an odd number of inverters.

9. A non-volatile storage media, storing codes readable for circuit design automation software, wherein the codes are used to record and form the propagation delay balancing circuit of claim 5.

10. A propagation delay balancing method, comprising at least the following steps:
    using a first delay chain and a second delay chain to generate a first delay signal and a second delay signal, respectively;
    using a signal change detecting element to generate a path switching controlling signal according to the first delay signal and the second delay signal, wherein a switching times of a path switching element is a multiple of a specific value, the first delay signal and the second delay signal outputted by the path switching element have substantially equal delay time;
    inputting the first delay signal and the second delay signal to a first input terminal and a second input terminal of the path switching element, respectively, wherein a one-to-one internal electrical connection between the first input terminal, the second input terminal, the first output terminal and the second output terminal of the path switching element is determined by the path switching controlling signal; and feeding the first delay signal back to one of the input terminal of the first delay chain and the input terminal of the second delay chain, and feeding the second delay signal back to the other of the input terminal of the first delay chain and the input terminal of the second delay chain according to the internal electrical connection of the path switching element.

\* \* \* \* \*